US012641716B2

(12) United States Patent

Hu et al.

(10) Patent No.: US 12,641,716 B2

(45) Date of Patent: May 26, 2026

(54) LIQUID COOLING USING PCB THROUGH HOLES

(71) Applicant: Cisco Technology, Inc., San Jose, CA (US)

(72) Inventors: Jordan K. Hu, Santa Clara, CA (US); Tushara Ramesh, San Jose, CA (US); Bhumil Depani, Irvine, CA (US); Aman Thukral, San Jose, CA (US); Jerrold M. Pianin, Peoria, AZ (US); Joel Richard Goergen, Soulsbyville, CA (US)

(73) Assignee: Cisco Technology, Inc., San Jose, CA (US)

( * ) Notice: Subject to any disclaimer, the term of this patent is extended or adjusted under 35 U.S.C. 154(b) by 188 days.

(21) Appl. No.: 18/418,164

(22) Filed: Jan. 19, 2024

(65) Prior Publication Data

US 2025/0240878 A1 Jul. 24, 2025

(51) Int. Cl.
*H05K 1/02* (2006.01)
*H05K 1/11* (2006.01)

(52) U.S. Cl.
CPC ........... *H05K 1/0272* (2013.01); *H05K 1/111* (2013.01); *H05K 1/115* (2013.01); *H05K 2201/064* (2013.01)

(58) Field of Classification Search
CPC ...... H05K 1/0272; H05K 1/111; H05K 1/115; H05K 2201/064; H01L 23/3735; H01L 23/49822; H01L 23/49827; H01L 23/5383; H01L 23/5384; H01L 23/473
See application file for complete search history.

(56) References Cited

U.S. PATENT DOCUMENTS

| | | | |
|---|---|---|---|
| 4,839,774 A | 6/1989 | Hamburgen | |
| 10,945,333 B1 | 3/2021 | Joshi et al. | |
| 2003/0205363 A1* | 11/2003 | Chu ..................... | F28D 15/0266 165/104.33 |
| 2007/0063337 A1* | 3/2007 | Schubert ............... | H01L 23/473 257/E23.098 |

(Continued)

OTHER PUBLICATIONS

International Search Report and Written Opinion for International Application No. PCT/US2025/011268, mailed Apr. 16, 2025, 15 Pages.

*Primary Examiner* — Stephen S Sul

(74) *Attorney, Agent, or Firm* — Rutan & Tucker, LLP; Ravi Mohan; Marc McClain

(57) ABSTRACT

Described herein are devices, systems, methods, and processes for an efficient liquid cooling system for electronic components mounted on a printed circuit board (PCB). The system utilizes PCB through holes to carry a liquid coolant. The cooling system includes a coolant loop through which a pump circulates the coolant. A cooling sub-assembly includes a cooling channel thermally coupled to the component to be cooled. The cooling sub-assembly further includes a coolant supply PCB through hole that carries the cooled coolant from a supply manifold on the bottom side of the PCB to the cooling channel on the top side of the PCB and a coolant return PCB through hole that carries the heated coolant from the cooling channel to the return manifold on the bottom side of the PCB. The cooling system includes a control system for coolant distribution that can react to component temperatures.

17 Claims, 5 Drawing Sheets

(56)      References Cited

U.S. PATENT DOCUMENTS

| 2009/0316360 A1* | 12/2009 | Campbell | H01L 23/473 |
| | | | 361/699 |
| 2011/0002102 A1 | 1/2011 | Brok et al. | |
| 2016/0050790 A1 | 2/2016 | Arvelo et al. | |
| 2016/0143184 A1 | 5/2016 | Campbell et al. | |
| 2019/0029105 A1* | 1/2019 | Smith | H01L 23/473 |
| 2019/0111862 A1* | 4/2019 | Dede | H05K 7/20145 |
| 2020/0352053 A1* | 11/2020 | Mizerak | H05K 7/205 |
| 2022/0201896 A1 | 6/2022 | Edmunds et al. | |
| 2023/0163048 A1* | 5/2023 | Wang | H01L 21/56 |
| | | | 257/713 |
| 2023/0215781 A1* | 7/2023 | Sutherland | H01L 23/473 |
| | | | 361/699 |
| 2023/0284377 A1 | 9/2023 | Zhou et al. | |
| 2024/0341027 A1* | 10/2024 | Zhou | H05K 7/20927 |

* cited by examiner

*700*

LIQUID COOLING USING PCB THROUGH HOLES

The present disclosure relates to electronics cooling systems. More particularly, the present disclosure relates to a liquid cooling system for electronic components mounted on a printed circuit board (PCB).

BACKGROUND

In the field of electronics, managing heat dissipation is a critical aspect of system design. As electronic components become more powerful, they may generate more heat, which can lead to performance degradation, system instability, and even component failure if not properly managed. Conventional air-cooling approaches, such as fans and heat sinks, have been widely utilized to dissipate heat from these components.

However, as the power consumption of systems continues to increase, the conventional air-cooling approaches are approaching their limits. They often struggle to effectively cool power-hungry components, leading to potential overheating issues. This can be particularly problematic in densely packed electronic systems where air flow can be restricted, exacerbating the cooling challenge.

Furthermore, while the industry has been developing liquid cooling solutions to address these issues, much of the focus has been on high-powered components such as application-specific integrated circuits (ASICs) or optical modules. These solutions often overlook smaller components involved in power distribution, which are also subject to increasing thermal stress. The lack of focus on smaller components can lead to uneven cooling within the system, potentially causing thermal stress and reducing the overall efficiency and lifespan of the components.

SUMMARY OF THE DISCLOSURE

Systems and methods for a liquid cooling system for electronic components mounted on a PCB in accordance with embodiments of the disclosure are described herein. In some embodiments, a printed circuit board (PCB) includes a plurality of coolant through holes, a top side, and a bottom side, and a manifold component including a PCB connection port configured to couple with at least one coolant through hole, and a coolant conduit, wherein the manifold component is disposed on a side of the PCB, such that a first coolant through hole of the plurality of coolant through holes is coupled with the PCB connection port.

In some embodiments, the manifold component further includes a plurality of fastening receptacles, and a plurality of fastener connectors coupled to the plurality of fastening receptacles and the PCB is utilized to couple the manifold component to the side of the PCB.

In some embodiments, solder is utilized to couple the manifold component to the side of the PCB.

In some embodiments, glue is utilized to couple the manifold component to the side of the PCB.

In some embodiments, the manifold component is disposed on the bottom side of the PCB.

In some embodiments, a heat-spreading member may be included in or coupled to an electronic component, and a cooling channel, wherein the electronic component is disposed on the PCB, and the electronic component is thermally coupled to the heat-spreading member and the cooling channel.

In some embodiments, the cooling channel is formed within the heat-spreading member.

In some embodiments, the top side of the PCB further includes a first groove, the heat-spreading member further includes a second groove, and the cooling channel is formed based on joining the first groove and the second groove.

In some embodiments, the PCB further includes a solder mask, and the first groove corresponds to a cutout portion in the solder mask.

In some embodiments, a first manifold component includes a first PCB connection port configured to couple with at least one coolant through hole, and a first coolant conduit, wherein the first manifold component is disposed on the bottom side of the PCB, such that the first coolant through hole of the plurality of coolant through holes is coupled with the first PCB connection port.

In some embodiments, the manifold component and the first manifold component create a closed coolant circulation system when disposed on the bottom side of the PCB and coupled to at least the coolant through hole and the first coolant through hole.

In some embodiments the closed coolant circulation system further includes the coolant conduit, the coolant through hole, the cooling channel, the first coolant through hole, and the first coolant conduit.

In some embodiments, the closed coolant circulation system further includes a coolant pump and a heat exchanger.

In some embodiments, the electronic component further includes an electrical terminal, the electrical terminal is electrically coupled to the heat-spreading member and the cooling channel, and the cooling channel is coupled to at least one of the coolant through hole or the first coolant through hole via a dual-purpose electrical and coolant connection.

In some embodiments, the PCB further includes a conducting plane, and at least one of the coolant through hole or the first coolant through hole is a plated coolant through hole that is electrically coupled to the cooling channel and the conducting plane.

In some embodiments, the manifold component further includes a first PCB connection port configured to couple with at least one coolant through hole, and a first coolant conduit, wherein the manifold component is disposed on the bottom side of the PCB, such that the first coolant through hole of the plurality of coolant through holes is coupled with the first PCB connection port, and the manifold component creates a closed coolant circulation system when disposed on the bottom side of the PCB and coupled to at least the coolant through hole and the first coolant through hole.

In some embodiments, the least one coolant through hole is coupled with the PCB connection port via at least one of glue, epoxy, a gasket, an O-ring, or solder.

In some embodiments, the manifold component is disposed on the top side of the PCB.

In some embodiments, a manifold component includes a printed circuit board (PCB) connection port configured to couple with at least one through hole of a PCB, and a coolant conduit, wherein the manifold component is configured to be disposed on the PCB, such that the PCB connection port is coupled with a through hole of the PCB.

In some embodiments, mounting an electronic component on a PCB includes placing the electronic component on a PCB, the electronic component being thermally coupled to a cooling channel, wherein each of two ends of the cooling channel is aligned with a respective coolant through hole of the PCB, creating a liquid-tight coolant connection between each of the two ends of the cooling channel and the respective coolant through hole of the PCB, and creating an electrical connection between an electrical terminal of the electronic component and a connection pad on a top side of the PCB.

Other objects, advantages, novel features, and further scope of applicability of the present disclosure will be set forth in part in the detailed description to follow, and in part will become apparent to those skilled in the art upon examination of the following or may be learned by practice of the disclosure. Although the description above contains many specificities, these should not be construed as limiting the scope of the disclosure but as merely providing illustrations of some of the presently preferred embodiments of the disclosure. As such, various other embodiments are possible within its scope. Accordingly, the scope of the disclosure should be determined not by the embodiments illustrated, but by the appended claims and their equivalents.

BRIEF DESCRIPTION OF DRAWINGS

The above, and other, aspects, features, and advantages of several embodiments of the present disclosure will be more apparent from the following description as presented in conjunction with the following several figures of the drawings.

Figure 1:
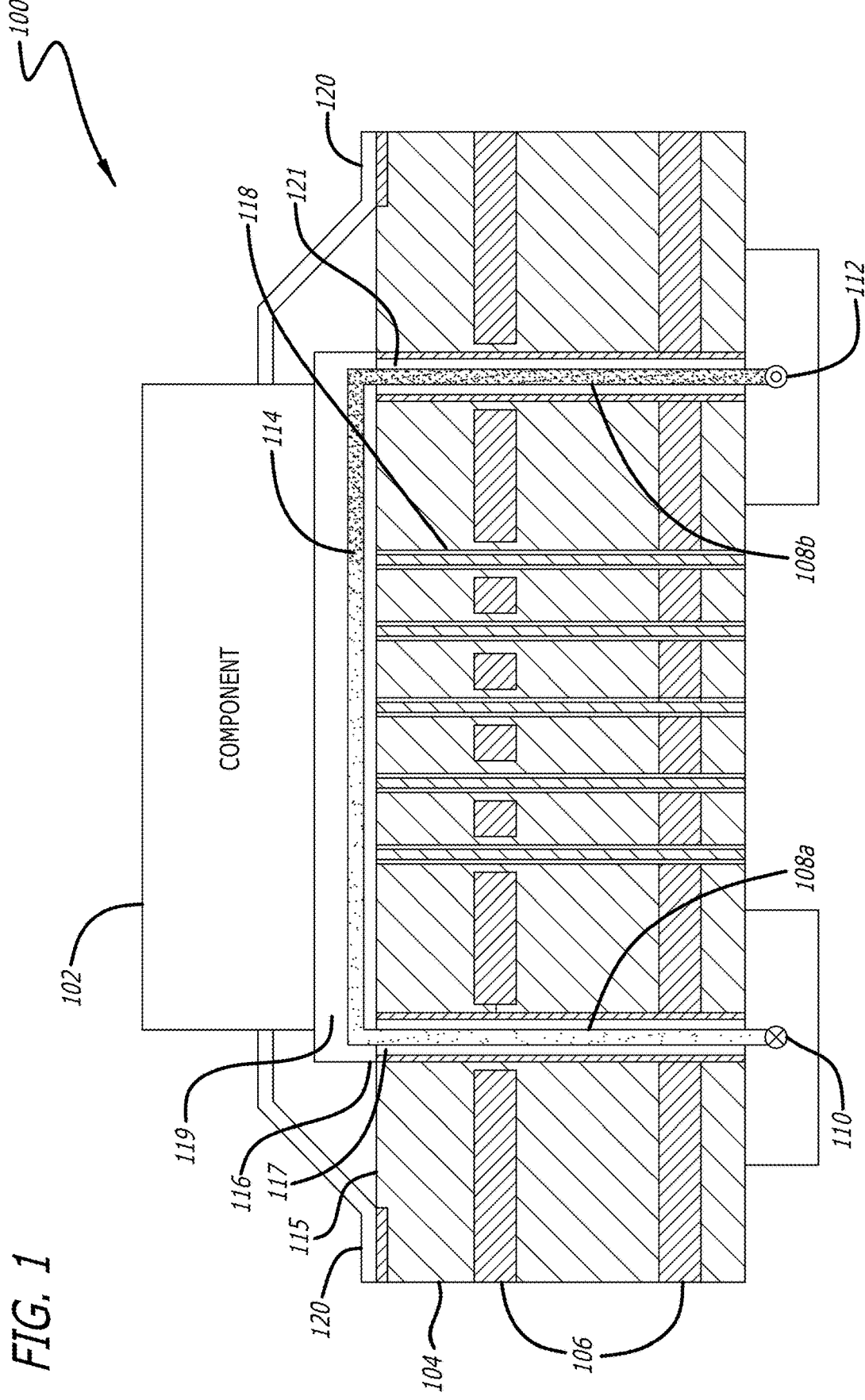
FIG. 1 is a diagram illustrating a cross-sectional view of a liquid cooling system for an electronic component mounted on a PCB in accordance with various embodiments of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

In response to the issues described above, devices and methods are discussed herein that provide a liquid cooling system for electronic components (or simply "components"

hereinafter) mounted on a printed circuit board (PCB). In many embodiments, the system may utilize PCB through holes to carry a liquid coolant, with components mounted directly to the PCB having both electrical and liquid-tight coolant connections. In a number of embodiments, an electronic component can have one or more dual-purpose electrical and coolant connections with the PCB. In a variety of embodiments, manifold components may be incorporated to supply and distribute the cooled liquid coolant from a coolant supply point to multiple coolant supply through holes on the PCB. Manifold components can be utilized to collect heated coolant from multiple coolant return through holes on the PCB and return the collected coolant to a coolant return point.

In some embodiments, the cooling system may include a coolant loop, which can include a coolant supply point, a coolant supply manifold component, one or more cooling sub-assemblies each of which includes a cooling channel that is thermally coupled to an electronic component to be cooled, a coolant return manifold component, a coolant return point, a heat exchanger between the coolant return point and the coolant supply point, where the heat exchanger removes thermal energy from the returned heated coolant and transforms the returned coolant back into cooled coolant, and appropriate hosing or piping for the coolant between different parts of the cooling system. In more embodiments, a suitably placed pump within the coolant loop may circulate the coolant through the coolant loop. In additional embodiments, the circulating coolant can include the cooled coolant that exits the heat exchanger and arrives at the coolant supply point. The coolant supply manifold component can distribute the cooled coolant from the coolant supply point to the cooling sub-assemblies, where in each cooling sub-assembly the cooled coolant absorbs and removes thermal energy from the electronic component, especially when the cooled coolant moves through the cooling channel, while at the same time the temperature of the coolant can increase and the cooled coolant may become heated coolant. The coolant return manifold component may collect the heated coolant from the cooling sub-assemblies and return the heated coolant to the coolant return point. The heated coolant can move from the coolant return point into the heat exchanger, where the heated coolant can be transformed back into cooled coolant, and the cooling cycle may continue.

In further embodiments, a cooling sub-assembly may include a coolant inlet on the bottom side of the PCB for receiving cooled coolant (e.g., from a coolant supply manifold component), a coolant supply PCB through hole for transferring the cooled coolant from the bottom side to the top side of the PCB, the cooling channel located on the top side of the PCB and thermally coupled to the electronic component to be cooled, a coolant return PCB through hole for transferring the heated coolant from the top side to the bottom side of the PCB, and a coolant outlet on the bottom side of the PCB for returning the heated coolant (e.g., to the coolant return manifold component). In general, hereinafter the side of the PCB where the to-be-cooled electronic component (e.g., a surface mount device (SMD)) is mounted may be referred to as the top side of the PCB, and the other side of the PCB can be referred to as the bottom side of the PCB. In still more embodiments, the cooling channel may be located within a heat-spreading member 119 (e.g., a metal mass, a metal pad, a metal slug, etc.) that is part of or (pre-) attached to the electronic component. In still further embodiments, the cooling channel can be formed by aligning and joining, in a liquid-tight manner, two grooves facing each other. By way of a non-limiting example, a first groove 117 can be created in the top layer of the PCB. To create the first groove, a cutout portion (e.g., a void) may be created in the corresponding location in the solder mask 115 as well. Further, a second groove 121 with an (approximately) same width can be created on the side of the heat-spreading member 119 (which can be part of or (pre-) attached to the electronic component) that would be directly facing the PCB when the component is mounted on the PCB. Accordingly, by aligning and joining, in a liquid-tight manner, the two grooves, a liquid-tight cooling channel may be created.

In still additional embodiments, liquid-tight coolant connections between the coolant supply PCB through hole and a first side of the cooling channel on the top side of the PCB and between a second side of the cooling channel and the coolant return PCB through hole on the top side of the PCB may be created or established. In some more embodiments, the liquid-tight coolant connections between the coolant supply/return PCB through holes and the cooling channel can be dual-purpose electrical and coolant connections. By way of a non-limiting example, liquid-tight solder may be utilized to create the dual-purpose electrical and coolant connections. In certain embodiments, the cooling channel (e.g., located within the heat-spreading metal mass) may be electrically connected to the ground of the component. Further, one or both of the coolant supply PCB through hole or the coolant return PCB through hole can be electrically connected to a ground plane in the PCB. By way of a non-limiting example, one or both of the PCB through holes may be plated (i.e., electroplated with a metal layer) and therefore be electrically conductive. Accordingly, the electrically conductive PCB through hole(s) can be electrically connected to the ground plane in the PCB. Therefore, by creating the dual-purpose electrical and coolant connection (s), the electronic component may be properly grounded.

In yet more embodiments, in general, liquid-tight seals may be created utilizing at least one of solder, elastomeric sealant, or underfill. In still yet more embodiments, a single manifold component may serve the functions of both supplying and returning the coolant. In many further embodiments, multiple manifold components can be utilized, where each of the manifold component may serve as either a coolant supply manifold component or a coolant return manifold component. In many additional embodiments, the coolant-carrying PCB through holes may be of various sizes, where a greater volume of coolant can be moved through a larger (wider) PCB through hole in the same amount of time. Accordingly, larger coolant-carrying PCB through holes (and larger cooling channels) may be utilized for electronic components that can generate more heat. In still yet further embodiments, a pipeline part can be installed on the bottom side of the PCB. The pipeline part, together with appropriate coolant-carrying PCB through holes, may be utilized to move the coolant across the PCB over a distance, such that the coolant can reach otherwise inaccessible sections of the PCB.

In still yet additional embodiments, a manifold component may be installed or attached to (i.e., disposed on) the bottom side of the PCB via various techniques. A manifold component can also be disposed on the top side of the PCB, as appropriate. Non-limiting examples of these joining techniques can be one or more of solder, adhesive, or mechanical attachment, gaskets, an O-ring, and/or PCB stiffener fasteners. By way of a non-limiting example, a manifold component may include one or more fastening receptacles. Fastener connectors coupled to the fastening receptacles and the PCB can be utilized to place, arrange, or otherwise position the manifold component. In particular, fastener connectors coupled to the fastening receptacles and the PCB can be utilized to couple the manifold component to the side of the PCB. The interface between the PCB and a manifold component can be sealed with, by way of non-limiting examples, glue, epoxy, gaskets, or solder. In several embodiments, a liquid-tight seal can be created between a manifold component and the bottom side of the PCB via various techniques. The seal may ensure that the coolant remains within the designated channels and does not leak onto the PCB or other electronic components. Non-limiting examples of these sealing techniques can be one or more of glue, epoxy, gaskets, O-rings, and/or solder. In several more embodiments, a manifold component may serve the function of a PCB stiffener as well.

In numerous embodiments, the cooling system may be utilized to cool high-current carrying conductors or planes in the PCB. In numerous additional embodiments, at least some of the current carrying conductors or planes in the PCB can be thermally coupled to the metal plating of one or more coolant-carrying PCB through holes, as appropriate, for heat spreading. This design may allow for the efficient cooling of high-speed signaling traces and can reduce loss in the trace. In further additional embodiments, the cooling system may include a control system for coolant distribution that can react to temperatures of electronic components. The control system can optimize the cooling effect and energy consumption. Further, in some embodiments, the control system may include a fail-safe control interrupt mechanism and leak detection to ensure the safe and efficient operation of the cooling system. In more embodiments, the electronic components to be cooled can be customizable for compatibility with the cooling system. By way of non-limiting examples, the customization may include the suitable placement of the electrical connections on the platform, the inclusion of a platform (e.g., a heat-spreading member, a metal mass, etc.) for creation of cooling channels, and/or the facilitation of the creation of liquid-tight seals. In summary, embodiments may provide a comprehensive liquid cooling solution for electronic components mounted on a PCB. The solution can effectively manage heat dissipation and extends the lifespan of electronic components. The embodiments may offer advantages over conventional air cooling systems as well. Existing PCB construction techniques and soldering techniques may be utilized to construct the liquid cooling system according to the various embodiments described herein. In particular, by providing superior cooling and reducing the operating temperature of components, the embodiments can effectively minimize current leakage that typically occurs at higher temperatures. The enhanced thermal management may not only improve the performance of the system (e.g., a lower powered system) but also contribute to greater power efficiency, thereby reducing overall power consumption.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom very large-scale integration (VLSI) circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Referring to FIG. 1, a diagram 100 illustrating a cross-sectional view of a liquid cooling system for an electronic component mounted on a PCB in accordance with various embodiments of the disclosure is shown. In many embodiments, a component 102 to be cooled may be mounted on a PCB 104. In a number of embodiments, the PCB 104 may include ground and/or power planes 106 within it. In a variety of embodiments, the cooling system may utilize two coolant-carrying PCB through holes, 108a and 108b, which can serve as conduits for the liquid coolant. A coolant inlet 110 can be located at the opening of the coolant supply PCB through hole 108a on the bottom side of the PCB, and a coolant outlet 112 can be located at the opening of the coolant return PCB through hole 108b on the bottom side of the PCB. In some embodiments, the coolant inlet 110 may be connected to a corresponding PCB connection port of a coolant supply manifold component, and the coolant outlet 112 can be connected to a corresponding PCB connection port of a coolant return manifold component.

In more embodiments, the cooling system may include a cooling channel 114, which can be located within a heat-spreading metal mass on the bottom of the component 102. The metal mass may directly face the top side of the PCB 104. The cooling channel 114 can be thermally coupled to the component 102, allowing the liquid coolant to absorb and remove thermal energy from the component 102 as the coolant moves through the cooling channel 114. In additional embodiments, one or more liquid-tight dual-purpose electrical and coolant connections 116 may be created between the ends of the cooling channel 114 and the openings of the coolant supply/return PCB through holes 108a and 108b on the top side of the PCB 104. The dual-purpose connections 116 can serve to both electrically connect the component 102 to the PCB 104 and to provide a liquid-tight seal for the coolant. In further embodiments, the dual-purpose connections 116 can facilitate grounding of the component 102. The heat-spreading metal mass, including the cooling channel 114, may be electrically connected to the ground of the component 102. Further, one or both of the coolant supply PCB through hole 108a or the coolant return PCB through hole 108b can be electrically connected to a ground plane in the PCB 104. Therefore, by creating the dual-purpose electrical and coolant connection(s) 116, the component 102 may be properly grounded.

In still more embodiments, the PCB 104 may include internal electrical connections 118 between its layers, allowing for the transmission of electrical signals within the PCB 104. Additionally, in still further embodiments, the component 102 can be electrically connected to the PCB 104 via electrical connections 120 between the terminals of the component 102 and connection pads on the top side of the PCB 140.

Although a specific embodiment for a liquid cooling system suitable for carrying out the various steps, processes, methods, and operations described herein is discussed with respect to FIG. 1, any of a variety of systems and/or processes may be utilized in accordance with embodiments of the disclosure. For example, the coolant supply and return PCB through holes can be designed to have different diameters to accommodate components that generate varying amounts of heat. The elements depicted in FIG. 1 may also be interchangeable with other elements of FIGS. 2-7 as required to realize a particularly desired embodiment.

Figure 2:
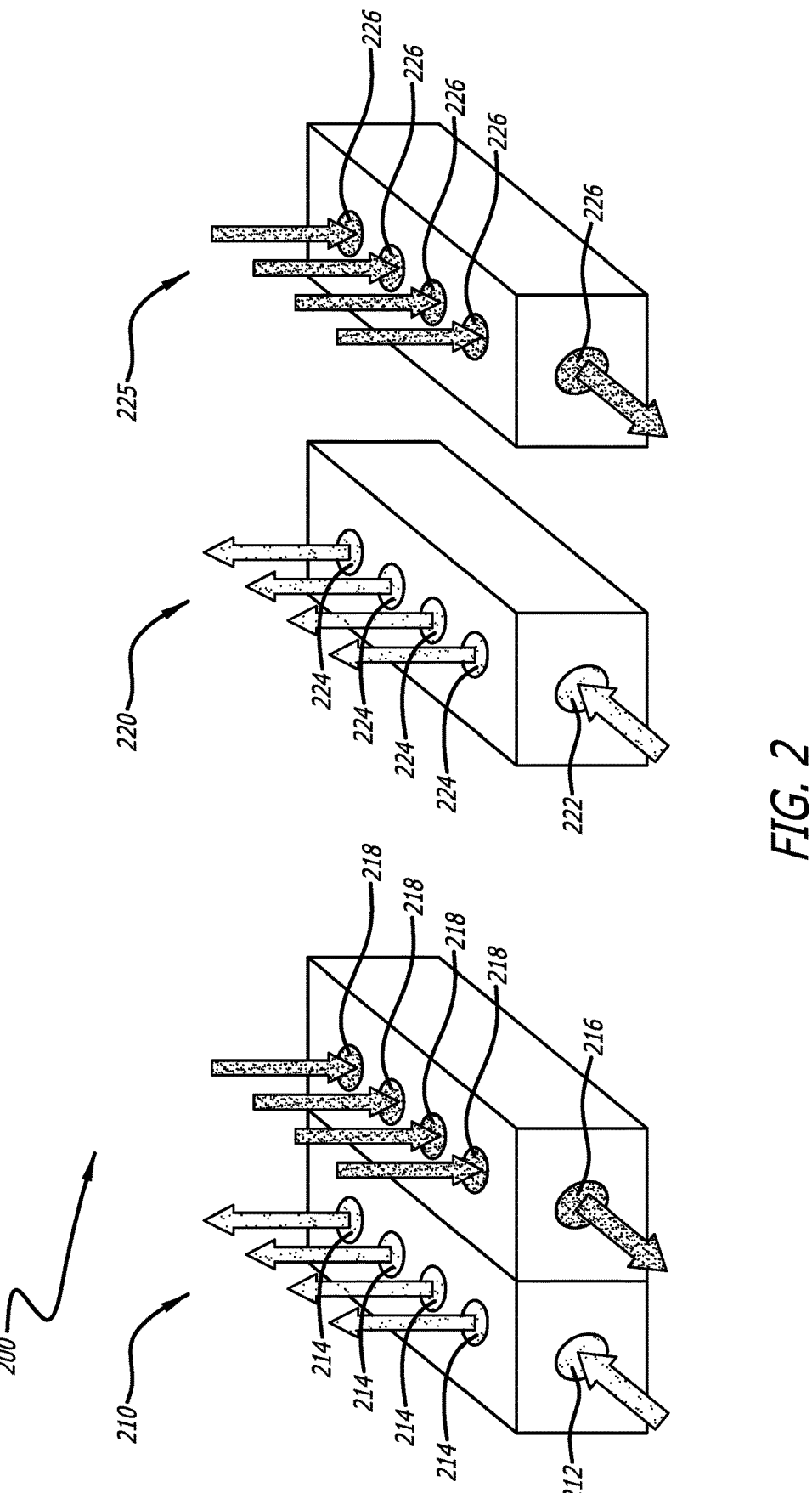
FIG. 2 is a diagram illustrating various manifold component configurations for a liquid cooling system in accordance with various embodiments of the disclosure.

Referring to FIG. 2, a diagram 200 illustrating various manifold component configurations for a liquid cooling system in accordance with various embodiments of the disclosure is shown. In many embodiments, a single manifold component 210 may serve the functions of both supplying and returning the coolant. The single manifold component 210 can receive cooled coolant via a coolant reception port 212 and distribute the cooled coolant to multiple locations (e.g., multiple coolant supply PCB through holes) via multiple coolant distribution PCB connection ports 214, where one or more coolant conduits inside the manifold component 210 may enable the distribution of the cooled coolant. The same manifold component 210 can also collect heated coolant from multiple locations (e.g., multiple coolant return PCB through holes) via multiple coolant collection PCB connection ports 218, and return the collected heated coolant via a coolant return port 216, where one or more coolant conduits inside the manifold component 210 may enable the collection of the heated coolant. Therefore, in a number of embodiments, the single manifold component 210 by itself may be sufficient for a cooling system according to various embodiments described herein. It is envisioned that the manifolds illustrated in FIG. 2, for example, may be attached, coupled, or otherwise originate from a cold plate without limitation.

In a variety of embodiments, a separate coolant supply manifold component 220 and a separate coolant return manifold component 225 may be used together for a cooling system according to various embodiments described herein. The coolant supply manifold component 220 can receive cooled coolant via a coolant reception port 222 and distribute the cooled coolant via multiple coolant distribution PCB connection ports 224, where one or more coolant conduits inside the manifold component 220 may enable the distribution of the cooled coolant. Further, the coolant return manifold component 225 can collect heated coolant via multiple coolant collection PCB connection ports 228, and return the collected heated coolant via a coolant return port 226, where one or more coolant conduits inside the manifold component 225 may enable the collection of the heated coolant.

In some embodiments, the manifold components can be designed with adjustable coolant flow rates to cater to the specific cooling needs of different electronic components. This can be achieved by incorporating flow control valves in the manifold components, allowing for dynamic adjustment of coolant flow based on real-time temperature data from the electronic components. In more embodiments, the manifold components can be designed to be modular and scalable, allowing for easy expansion or reduction of the cooling system to accommodate different numbers of electronic components or different PCB layouts. This can provide flexibility and cost-effectiveness for systems with varying cooling requirements.

Although a specific embodiment for various manifold component configurations suitable for carrying out the various steps, processes, methods, and operations described herein is discussed with respect to FIG. 2, any of a variety of systems and/or processes may be utilized in accordance with embodiments of the disclosure. For example, the manifold components can be designed to have different numbers of PCB connection ports to accommodate systems with varying numbers of components to be cooled. The elements depicted in FIG. 2 may also be interchangeable with other elements of FIGS. 1 and 3-7 as required to realize a particularly desired embodiment.

Figure 3:
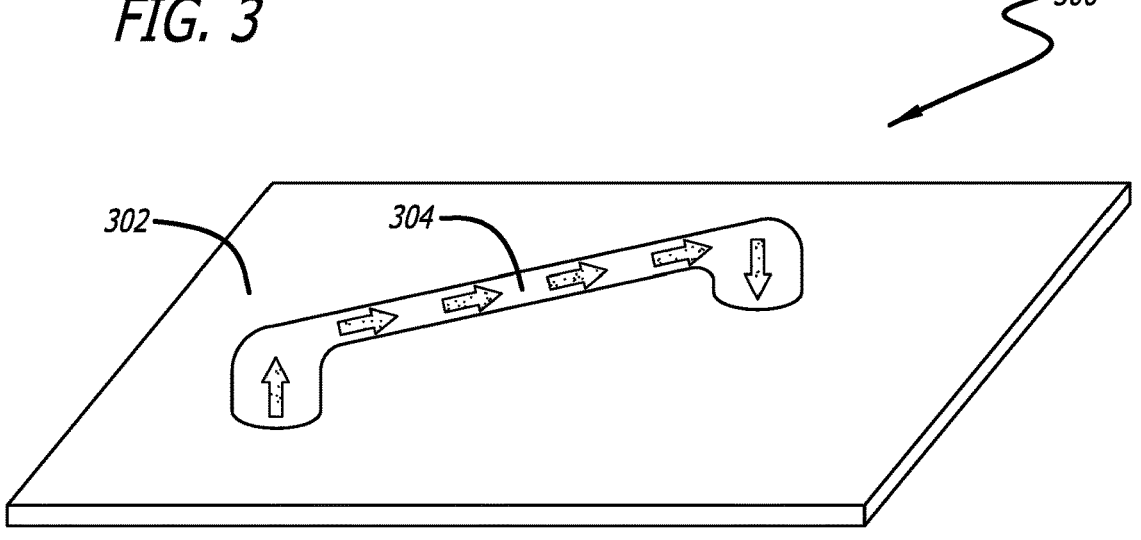
FIG. 3 is a diagram illustrating a PCB with a pipeline part in accordance with various embodiments of the disclosure.

Referring to FIG. 3, a diagram 300 illustrating a PCB with a pipeline part in accordance with various embodiments of the disclosure is shown. In many embodiments, the pipeline part 304 may be installed on the bottom side of the PCB 302. In a number of embodiments, the pipeline part 304, together with appropriate coolant-carrying PCB through holes (not shown), may be utilized to move the liquid coolant across the PCB 302 over a distance. This design can allow the coolant to reach otherwise inaccessible sections of the PCB 302.

In a variety of embodiments, the pipeline part 304 can be designed with a specific shape or path to optimize the cooling effect. By way of a non-limiting example, the pipeline part 304 can be arranged to pass closer to electronic components that generate more heat or need more cooling. This can ensure that these components receive sufficient cooling. In some embodiments, the pipeline part 304 can be made from materials with high thermal conductivity, such as, but not limited to, copper or aluminum. This can further enhance the cooling efficiency by allowing the pipeline part 304 itself to act as a heat sink, absorbing and dissipating heat from the PCB 302.

In more embodiments, the pipeline part 304 may be designed with a flexible structure, allowing it to be bent or shaped as needed to fit different PCB layouts. This can provide additional flexibility in the design and assembly of the cooling system. In additional embodiments, the pipeline part 304 may be designed with a transparent or semi-transparent material, allowing for visual inspection of the coolant flow. This can help in identifying any issues such as blockages or leaks in the cooling system.

Although a specific embodiment for a PCB with a pipeline part suitable for carrying out the various steps, processes, methods, and operations described herein is discussed with respect to FIG. 3, any of a variety of systems and/or processes may be utilized in accordance with embodiments of the disclosure. For example, the pipeline part can be designed to have different lengths or diameters to accommodate PCBs of varying sizes or layouts. The elements depicted in FIG. 3 may also be interchangeable with other elements of FIGS. 1, 2, and 4-7 as required to realize a particularly desired embodiment.

Figure 4:
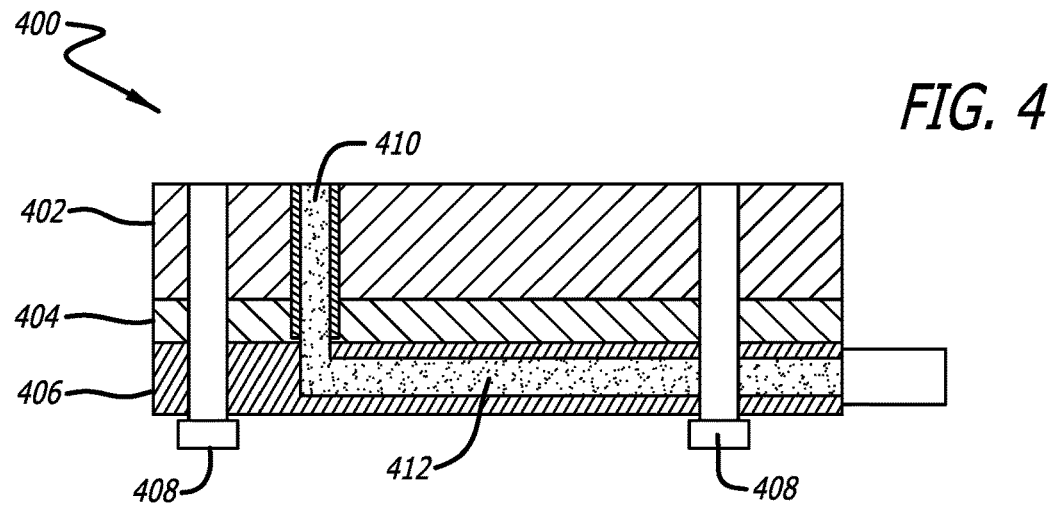
FIG. 4 is a diagram illustrating a cross-sectional view of a manifold component attached to a PCB in accordance with various embodiments of the disclosure.

Referring to FIG. 4, a diagram 400 illustrating a cross-sectional view of a manifold component attached to a PCB in accordance with various embodiments of the disclosure is shown. In many embodiments, the manifold component 406, which may correspond to any of the manifold components 210, 220, 225 depicted in FIG. 2, may be attached to the bottom side of the PCB 402. In a number of embodiments, a sealant 404 can be applied between the bottom side of the PCB 402 and the manifold component 406. The sealant 404 may create a liquid-tight seal, ensuring that the coolant remains within the designated channels and does not leak onto the PCB 402 or other electronic components. Various types of sealants can be used to create the liquid-tight seal, including, but not limited to, solder, elastomeric sealant, or underfill, depending on the specific specifications of the application. In a variety of embodiments, the sealant 404 may also serve a dual purpose as a thermal interface material, enhancing the heat transfer between the PCB 402 and the manifold component 406. This can further improve the cooling efficiency of the system.

In some embodiments, a coolant-carrying PCB through hole 410 may allow the coolant to move from one side of the PCB 402 to the other side. In more embodiments, a coolant-carrying channel 412 in the manifold component 406 can lead to the manifold component PCB connection port connected to the coolant-carrying PCB through hole 410 at the bottom side of the PCB 402. The liquid-tight seal created by the sealant 404 may ensure that the connection between the manifold component PCB connection port and the opening of the coolant-carrying PCB through hole 410 is liquid-tight. In additional embodiments, the coolant-carrying PCB through hole 410 and the coolant-carrying channel 412 can be designed with specific shapes or paths to optimize the flow of coolant, reducing flow resistance and improving cooling performance.

In further embodiments, mounting fasteners 408 (e.g., fastener connectors) may be utilized to secure the manifold component 406 to the PCB 402. In still more embodiments, various techniques can be utilized to secure the manifold component to the PCB, including, but not limited to, solder, adhesive, or mechanical attachment. The fasteners 408 shown in the embodiments depicted in FIG. 4 may represent just a non-limiting example of such techniques. In still further embodiments, the mounting fasteners 408 may be designed to provide additional functions, such as, but not limited to, acting as heat conductors to further enhance the heat dissipation from the PCB 402 to the manifold component 406.

Although a specific embodiment for a manifold component attached to a PCB suitable for carrying out the various steps, processes, methods, and operations described herein is discussed with respect to FIG. 4, any of a variety of systems and/or processes may be utilized in accordance with embodiments of the disclosure. For example, the manifold component may be integrated with a heat sink or other thermal management component, providing a combined solution for both coolant distribution and heat dissipation. The elements depicted in FIG. 4 may also be interchangeable with other elements of FIGS. 1-3 and 5-7 as required to realize a particularly desired embodiment.

Figure 5:
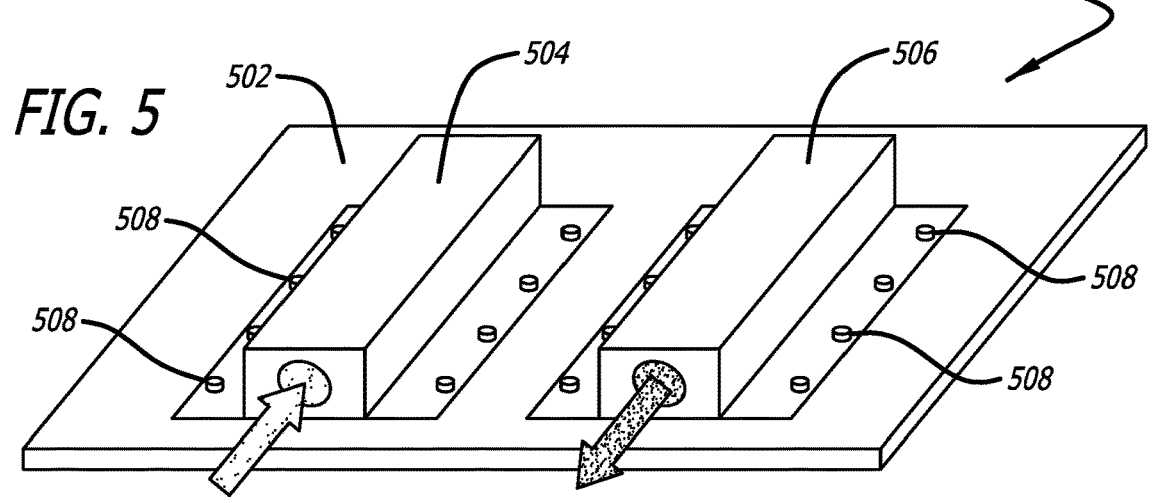
FIG. 5 is a diagram illustrating a coolant supply manifold component and a coolant return manifold component secured to a PCB in accordance with various embodiments of the disclosure.

Referring to FIG. 5, a diagram 500 illustrating a coolant supply manifold component and a coolant return manifold component secured to a PCB in accordance with various embodiments of the disclosure is shown. In the embodiments depicted in FIG. 5, a coolant supply manifold component 504 and a coolant return manifold component 506 may be similar to the coolant supply manifold component 220 and the coolant return manifold component 225 depicted in FIG. 2, respectively. In many embodiments, the coolant supply manifold component 504 and the coolant return manifold component 506 can be secured to the bottom side of the PCB 502. In a number of embodiments, mounting fasteners 508, similar to the mounting fasteners 408 depicted in FIG. 4, may be utilized to secure the two manifold components 504 and 506 to the PCB 502. The mounting fasteners 508 can ensure a stable and secure connection between the manifold components 504 and 506 and the PCB 502. In a variety of embodiments, the mounting fasteners 508 could be designed with thermal conductive properties, allowing them to serve as additional heat transfer paths from the PCB 502 to the manifold components 504 and 506. This could further enhance the cooling efficiency of the system.

In some embodiments, in addition to the primary function of distributing and collecting coolant, the manifold components 504 and 506 can also serve the purpose of PCB stiffeners. In other words, by providing additional structural support, the manifold components 504 and 506 may help to prevent the PCB 502 from bending or warping, which can be particularly beneficial in high-density or high-power applications. In more embodiments, the manifold components 504 and 506 could be designed with features to facilitate their installation and removal, such as tool engagement features or quick-release mechanisms. This could make the maintenance or modification of the cooling system easier and more efficient.

Although a specific embodiment for a coolant supply manifold component and a coolant return manifold component secured to a PCB suitable for carrying out the various steps, processes, methods, and operations described herein is discussed with respect to FIG. 5, any of a variety of systems and/or processes may be utilized in accordance with embodiments of the disclosure. For example, the coolant supply manifold component and the coolant return manifold component may be designed with additional vibration dampening elements, to further enhance the performance and reliability of the cooling system. The elements depicted in FIG. 5 may also be interchangeable with other elements of FIGS. 1-4, 6, and 7 as required to realize a particularly desired embodiment.

Figure 6:
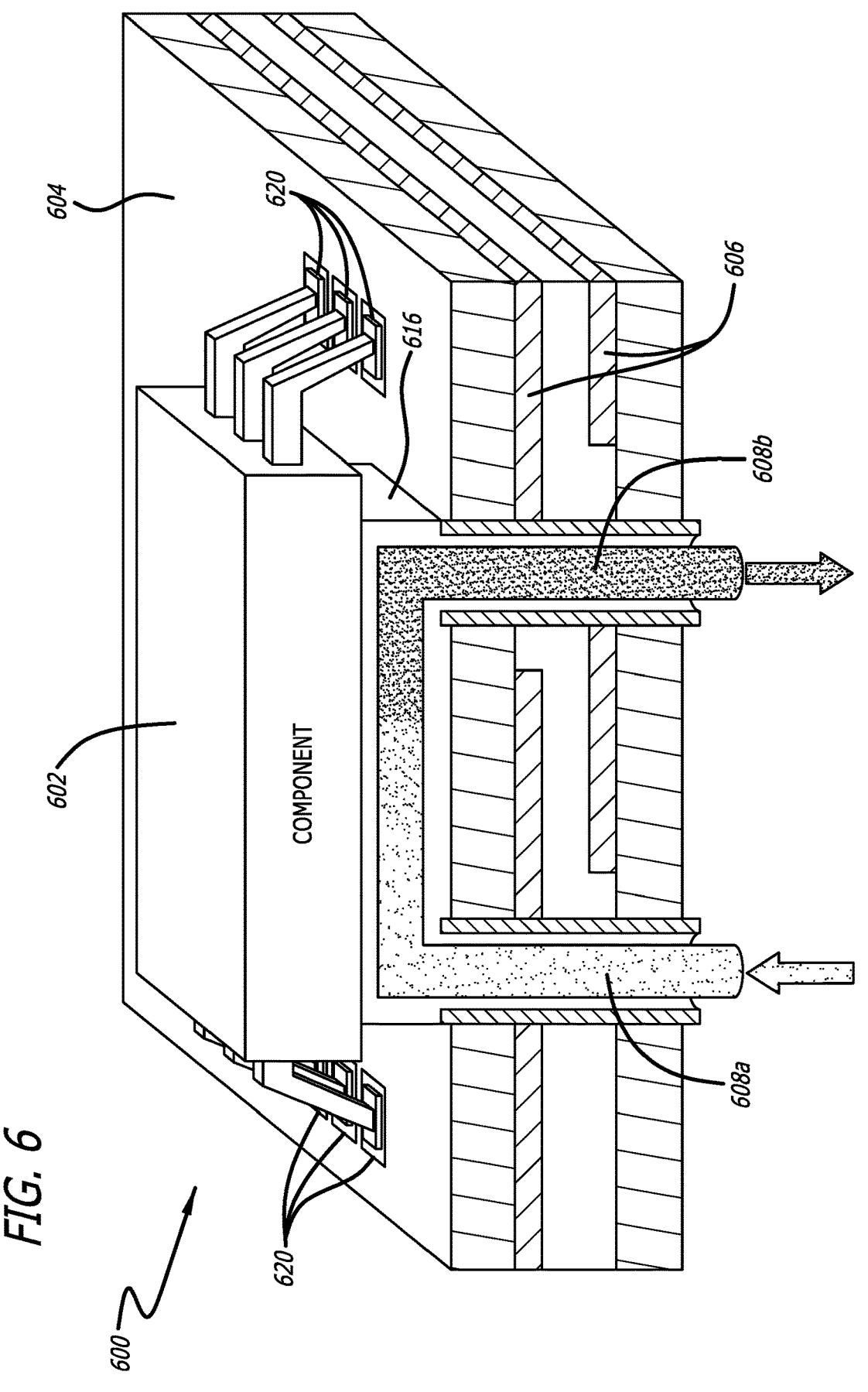
FIG. 6 is a diagram illustrating a liquid cooling system for an electronic component mounted on a PCB in accordance with various embodiments of the disclosure.

Referring to FIG. 6, a diagram 600 illustrating a liquid cooling system for an electronic component mounted on a PCB in accordance with various embodiments of the disclosure is shown. In many embodiments, a component 602 to be cooled may be mounted on a top side of a PCB 604. In a number of embodiments, the PCB 604 can include ground and/or power planes 606 within it.

In a variety of embodiments, the cooling system may utilize two plated coolant-carrying PCB through holes 608a and 608b. The coolant-carrying PCB through holes 608a and 608b can serve as conduits for the liquid coolant, allowing the coolant to circulate through the PCB 604. In some embodiments, the cooling system may include one or more dual-purpose electrical and coolant connections 616 between the ends of the cooling channel, which can be located within a heat-spreading metal mass of the component 602, and the openings of the coolant-carrying PCB through holes 608a and 608b on the top side of the PCB 604. These dual-purpose connections 616 can serve to both electrically connect the component 602 to the PCB 604 (e.g., a plane in the PCB 604) and to provide a liquid-tight seal for the coolant. In more embodiments, the dual-purpose connections 616 may have a specific shape or material to optimize the heat transfer from the component 602 to the coolant. By way of non-limiting examples, the dual-purpose connections 616 can be created utilizing a material with high thermal conductivity, such as copper or silver.

In additional embodiments, the component 602 may be electrically connected to the PCB 604 via electrical connections 620 between the terminals of the component 602 and connection pads on the top side of the PCB 604. In further embodiments, the coolant flowing through the coolant-carrying PCB through holes 608a and 608b, especially the cooled coolant in the coolant supply PCB through hole 608a, can cool the conducting planes 606 in the PCB 604. This design may allow for the efficient cooling of high-speed signaling traces and can reduce loss in the trace. To achieve this end, in still more embodiments, at least one plated coolant-carrying PCB through hole 608a/608b may not be isolated one or more copper layers or planes in the PCB 604. In still further embodiments, the coolant-carrying PCB through holes 608a and 608b can be designed with a specific diameter or cross-sectional shape to optimize the flow of coolant, reducing flow resistance and improving cooling performance.

Although a specific embodiment for a liquid cooling system suitable for carrying out the various steps, processes, methods, and operations described herein is discussed with respect to FIG. 6, any of a variety of systems and/or processes may be utilized in accordance with embodiments of the disclosure. For example, the coolant-carrying PCB through holes may be filled with a thermally conductive material to improve the performance to cool the PCB. The elements depicted in FIG. 6 may also be interchangeable with other elements of FIGS. 1-5 and 7 as required to realize a particularly desired embodiment.

Figure 7:
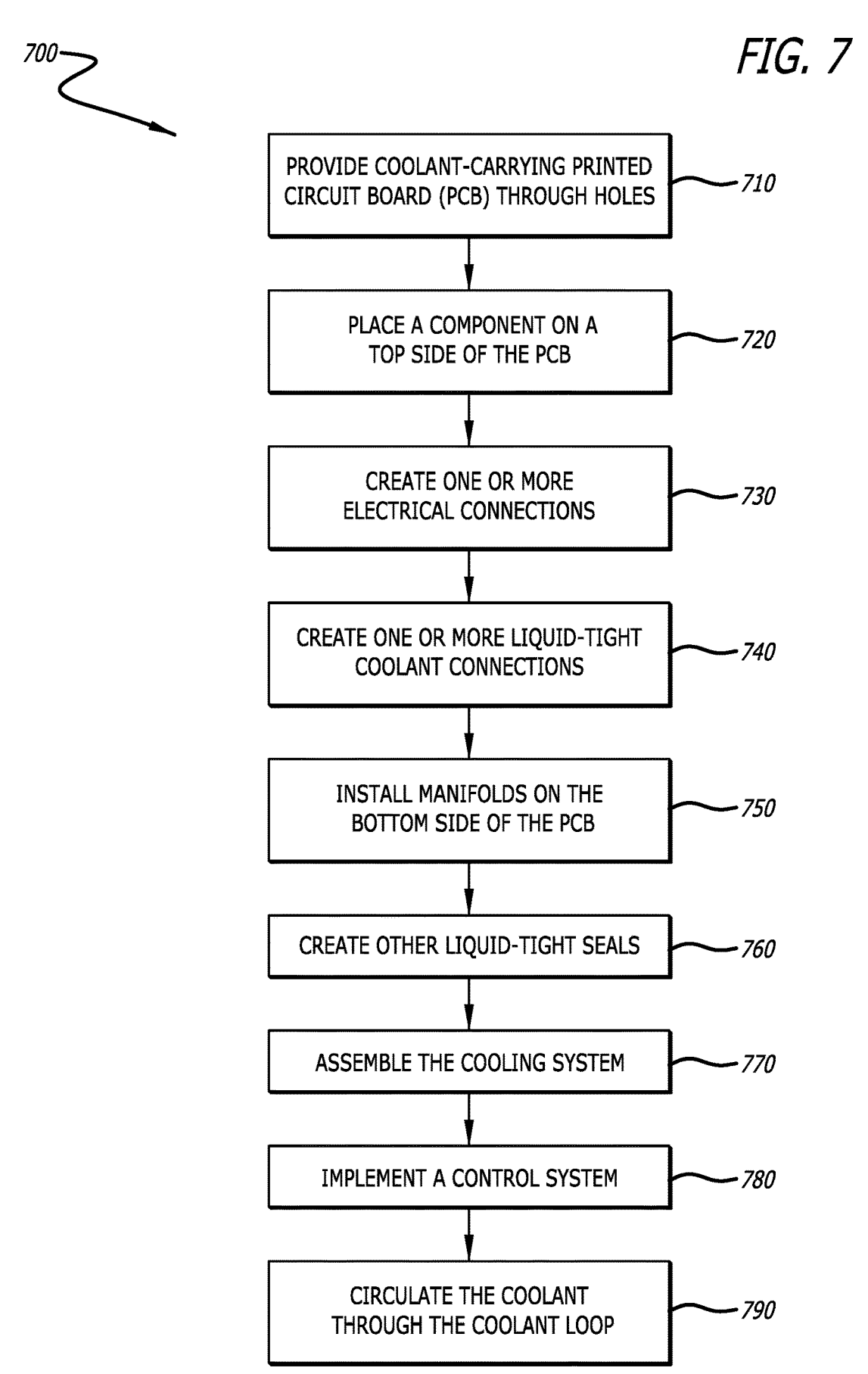
FIG. 7 is a flowchart showing a process for utilizing a liquid cooling system for electronic components mounted on a PCB in accordance with various embodiments of the disclosure.

Referring to FIG. 7, a flowchart showing a process 700 for utilizing a liquid cooling system for electronic components mounted on a PCB in accordance with various embodiments of the disclosure is shown. In many embodiments, the process 700 may provide coolant-carrying PCB through holes (block 710). The through holes can serve as conduits for the liquid coolant, allowing the liquid coolant to move between the two sides of the PCB. In a number of embodiments, the size of some through holes can be adjusted based on the cooling specifications of the specific component. In a variety of embodiments, the number and locations of the through holes may be determined based on the number and locations of components that may need liquid cooling.

In some embodiments, the process 700 may place a component on a top side of the PCB (block 720). In more embodiments, the component can include or be (pre-) attached to a heat-spreading member (e.g., a metal mass) within which a cooling channel may be pre-formed. In additional embodiments, the component can be placed such that the ends of the cooling channel are aligned with the openings of the coolant-carrying PCB through holes on the top side of the PCB.

In further embodiments, the process 700 may create one or more electrical connections (block 730). These connections can allow for the transmission of electrical signals between the component and the PCB. In still more embodiments, the electrical connections may be between connection terminals of the component and connection pads on the top side of the PCB.

In still further embodiments, the process 700 may create one or more liquid-tight coolant connections (block 740). In still additional embodiments, the coolant connections can be between ends of a cooling channel and openings of coolant-carrying PCB through holes on the top side of the PCB. In some more embodiments, the liquid-tight connections may be dual-purpose electrical and coolant connections. The dual-purpose connections can serve both to electrically connect the component to the PCB and to provide a liquid-tight seal for the coolant. In certain embodiments, the dual-purpose electrical and coolant connections may form part of the electrical path between a ground terminal of the component and a ground plane in the PCB.

In yet more embodiments, the process 700 may install manifold components on the bottom side of the PCB (block 750). In still yet more embodiments, a coolant supply manifold component may supply cooled coolant from a coolant supply point to multiple coolant supply PCB through holes on the bottom side of the PCB. In many further embodiments, a coolant return manifold component can collect heated coolant from multiple coolant return PCB through holes on the bottom side of the PCB and return the collected heated coolant to a coolant return point. In many additional embodiments, the manifold components can be designed to optimize the flow of coolant based on the specific layout of the PCB and the components to be cooled.

In still yet further embodiments, the process 700 may create other liquid-tight seals (block 760). These seals can ensure that the coolant remains within the designated channels and does not leak onto the PCB or other electronic components. In still yet additional embodiments, various sealing techniques can be utilized, such as, but not limited to, solder, elastomeric sealant, or underfill.

In several embodiments, the process 700 may assemble the cooling system (block 770). This can involve connecting all the components of the cooling system, including the PCB, the components to be cooled, the manifold components, the pump, and the heat exchanger. The assembly process can be controlled to ensure the integrity and efficiency of the cooling system.

In several more embodiments, the process 700 may implement a control system (block 780). In numerous embodiments, the control system can monitor the temperature of the components and adjust the flow of coolant as appropriate to maintain optimal cooling. In numerous additional embodiments, the control system can be designed to respond quickly to changes in component temperature, ensuring consistent cooling performance.

In further additional embodiments, the process 700 may circulate the coolant through the coolant loop (block 790). In some embodiments, this can involve pumping the coolant through the coolant-carrying through holes, the cooling channels in the components, the manifold components, and the heat exchanger. The circulation of the coolant can be optimized to maximize the cooling effect while minimizing energy consumption.

Although a specific embodiment for utilizing a liquid cooling system suitable for carrying out the various steps, processes, methods, and operations described herein is discussed with respect to FIG. 7, any of a variety of systems and/or processes may be utilized in accordance with embodiments of the disclosure. For example, the control system may anticipate changes in component temperature based on usage patterns and adjust the coolant flow in advance. The elements depicted in FIG. 7 may also be interchangeable with other elements of FIGS. 1-6 as required to realize a particularly desired embodiment.

Although the present disclosure has been described in certain specific aspects, many additional modifications and variations would be apparent to those skilled in the art. In particular, any of the various processes described above can be performed in alternative sequences and/or in parallel (on the same or on different computing devices) in order to achieve similar results in a manner that is more appropriate to the requirements of a specific application. It is therefore to be understood that the present disclosure can be practiced other than specifically described without departing from the scope and spirit of the present disclosure. Thus, embodiments of the present disclosure should be considered in all respects as illustrative and not restrictive. It will be evident to the person skilled in the art to freely combine several or all of the embodiments discussed here as deemed suitable for a specific application of the disclosure. Throughout this disclosure, terms like "advantageous", "exemplary" or "example" indicate elements or dimensions which are particularly suitable (but not essential) to the disclosure or an embodiment thereof and may be modified wherever deemed suitable by the skilled person, except where expressly required. Accordingly, the scope of the disclosure should be determined not by the embodiments illustrated, but by the appended claims and their equivalents.

Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, workpiece, and fabrication material detail can be made, without departing from the spirit and scope of the present disclosure, as set forth in the appended claims, as might be apparent to those of ordinary skill in the art, are also encompassed by the present disclosure.

What is claimed is:

1. A system, comprising:
a printed circuit board (PCB) comprising:
    a plurality of coolant through holes;
    a top side; and
    a bottom side; and
a manifold component comprising:
    a PCB connection port configured to couple with at least one coolant through hole of the plurality of coolant through holes; and
    a coolant conduit,
wherein the manifold component is disposed on a side of the PCB, such that a first coolant through hole of the plurality of coolant through holes is coupled with the PCB connection port;
an electronic component;
    a heat-spreading member included in or coupled to the electronic component; and
    a cooling channel, wherein the electronic component is disposed on the PCB, and the electronic component is thermally coupled to the heat-spreading member and the cooling channel;

the top side of the PCB further comprises a first groove, the heat-spreading member further comprises a second groove, and the cooling channel is formed based on joining the first groove and the second groove, wherein the PCB further comprises a solder mask, and the first groove corresponds to a cutout portion in the solder mask.

2. The system of claim 1, wherein the manifold component further comprises a plurality of fastening receptacles, and a plurality of fastener connectors coupled to the plurality of fastening receptacles and the PCB is utilized to couple the manifold component to the side of the PCB.

3. The system of claim 1, wherein solder is utilized to couple the manifold component to the side of the PCB.

4. The system of claim 1, wherein glue is utilized to couple the manifold component to the side of the PCB.

5. The system of claim 1, wherein the manifold component is disposed on the bottom side of the PCB.

6. The system of claim 1, wherein the cooling channel is formed within the heat-spreading member.

7. The system of claim 1 6, further comprising:

a first manifold component, comprising:

a first PCB connection port configured to couple with the at least one coolant through hole of the plurality of coolant through holes; and a first coolant conduit, wherein the first manifold component is disposed on the bottom side of the PCB, such that the first coolant through hole of the plurality of coolant through holes is coupled with the first PCB connection port.

8. The system of claim 7, wherein the manifold component and the first manifold component create a closed coolant circulation system when disposed on the bottom side of the PCB and coupled to at least at least one the coolant through hole and the first coolant through hole.

9. The system of claim 8, wherein the closed coolant circulation system further comprises the coolant conduit, the at least one coolant through hole, the cooling channel, the first coolant through hole, and the first coolant conduit.

10. The system of claim 8, wherein the closed coolant circulation system further comprises a coolant pump and a heat exchanger.

11. The system of claim 7, wherein the electronic component further comprises an electrical terminal, the electrical terminal is electrically coupled to the heat-spreading member and the cooling channel, and the cooling channel is coupled to the at least one coolant through hole or the first coolant through hole via a dual-purpose electrical and coolant connection.

12. The system of claim 11, wherein the PCB further comprises a conducting plane, and the at least one coolant through hole or the first coolant through hole is a plated coolant through hole that is electrically coupled to the cooling channel and the conducting plane.

13. The system of claim 1, wherein the manifold component further comprises:

a first PCB connection port configured to couple with at least one coolant through hole; and a first coolant conduit, wherein the manifold component is disposed on the bottom side of the PCB, such that the first coolant through hole of the plurality of coolant through holes is coupled with the first PCB connection port, and the manifold component creates a closed coolant circulation system when disposed on the bottom side of the PCB and coupled to at least the at least one coolant through hole and the first coolant through hole.

14. The system of claim 1, wherein the least one coolant through hole is coupled with the PCB connection port via at least one of glue, epoxy, a gasket, an O-ring, or solder.

15. The system of claim 1, wherein the manifold component is disposed on the top side of the PCB.

16. A manifold component, comprising:

a printed circuit board (PCB) connection port configured to couple with at least one through hole of a PCB; and a coolant conduit;

wherein the manifold component is configured to be disposed on the PCB, such that the PCB connection port is coupled with a through hole of the PCB;

an electronic component;

a heat-spreading member included in or coupled to the electronic component; and a cooling channel, wherein the electronic component is disposed on the PCB, and the electronic component is thermally coupled to the heat-spreading member and the cooling channel;

a first manifold component, comprising:

a first PCB connection port configured to couple with at least one coolant through hole; and a first coolant conduit, wherein the first manifold component is disposed on the bottom side of the PCB, such that the first coolant through hole of the plurality of coolant through holes is coupled with the first PCB connection port;

wherein the electronic component further comprises an electrical terminal, the electrical terminal is electrically coupled to the heat-spreading member and the cooling channel, and the cooling channel is coupled to at least one of the coolant through hole or the first coolant through hole via a dual-purpose electrical and coolant connection.

17. A method for mounting an electronic component on a printed circuit board (PCB), comprising:

placing the electronic component on the PCB, the electronic component being thermally coupled to a cooling channel, wherein each of two ends of the cooling channel is aligned with a respective coolant through hole of the PCB;

creating a liquid-tight coolant connection between each of the two ends of the cooling channel and the respective coolant through hole of the PCB; and creating an electrical connection between an electrical terminal of the electronic component and a connection pad on a top side of the PCB;

the top side of the PCB further comprises a first groove, the heat-spreading member further comprises a second groove, and the cooling channel is formed based on joining the first groove and the second groove;

wherein the PCB further comprises a solder mask, and the first groove corresponds to a cutout portion in the solder mask;

wherein the electronic component further comprises an electrical terminal, the electrical terminal is electrically coupled to the heat-spreading member and the cooling channel, and the cooling channel is coupled to at least one of the coolant through hole or the first coolant through hole via a dual-purpose electrical and coolant connection.

\* \* \* \* \*